United States Patent [19]
Takahashi

[11] Patent Number: 5,307,511
[45] Date of Patent: Apr. 26, 1994

[54] ANTI-FALL STRUCTURE FOR BATTERY COVER OF RADIO COMMUNICATION APPARATUS OR SIMILAR APPARATUS

[75] Inventor: Makoto Takahashi, Tokyo, Japan

[73] Assignee: NEC Corporation, Tokyo, Japan

[21] Appl. No.: 827,628

[22] Filed: Jan. 29, 1992

[30] Foreign Application Priority Data

Jan. 30, 1991 [JP] Japan ............................. 3-002638[U]

[51] Int. Cl.$^5$ .............................................. H04B 1/08
[52] U.S. Cl. ..................................... 455/90; 455/128; 455/349; 455/351; 340/825.44; 220/346; 292/33
[58] Field of Search ................. 455/90, 128, 343, 347, 455/348, 349, 351; 340/825.44; 292/33, 157, 162, 253, DIG. 16, DIG. 63; 220/345, 346, 347

[56] References Cited

U.S. PATENT DOCUMENTS

| 3,942,630 | 3/1976 | Phillips | 220/346 |
|---|---|---|---|
| 3,960,270 | 6/1976 | May | 220/346 |
| 4,641,370 | 2/1987 | Oyamada | 455/351 |
| 4,819,829 | 4/1989 | Rosten et al. | 220/346 |
| 4,880,712 | 11/1989 | Gordecki | 220/346 |
| 5,082,137 | 1/1992 | Weinstein | 220/346 |

FOREIGN PATENT DOCUMENTS 0298759 1/1989 European Pat. Off. ............. 455/90
WO90109-55A1 9/1990 PCT Int'l Appl.
2134734A 8/1984 United Kingdom ............... 455/347

Primary Examiner—Reinhard J. Eisenzopf
Assistant Examiner—Andrew Faile
Attorney, Agent, or Firm—Sughrue, Mion, Zinn, Macpeak & Seas

[57] ABSTRACT

An anti-fall structure for preventing the battery cover of a radio communication apparatus or similar apparatus from accidentally coming off the casing of the apparatus. A thumb piece is fitted on the casing in such a manner as to be slidable into and out of locking engagement with a notch formed in the battery cover in a direction substantially perpendicular to a direction in which the battery cover is slidable. The thumb piece is held in a locking position due to the engagement of a recess formed in the inner periphery of the casing and a flexible locking member affixed to the thumb piece. The thumb piece does not unlock the battery cover unless operated intentionally by a predetermined force and, therefore, positively retains it. The locking member is long enough to surely mate with the inner periphery of the casing. This, coupled with the fact that the inner periphery of the casing catches lugs provided on the thumb piece in the locked position, the thumb piece itself is prevented from coming off.

4 Claims, 6 Drawing Sheets

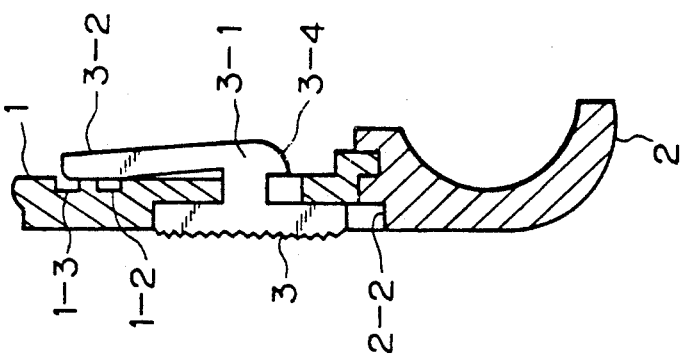
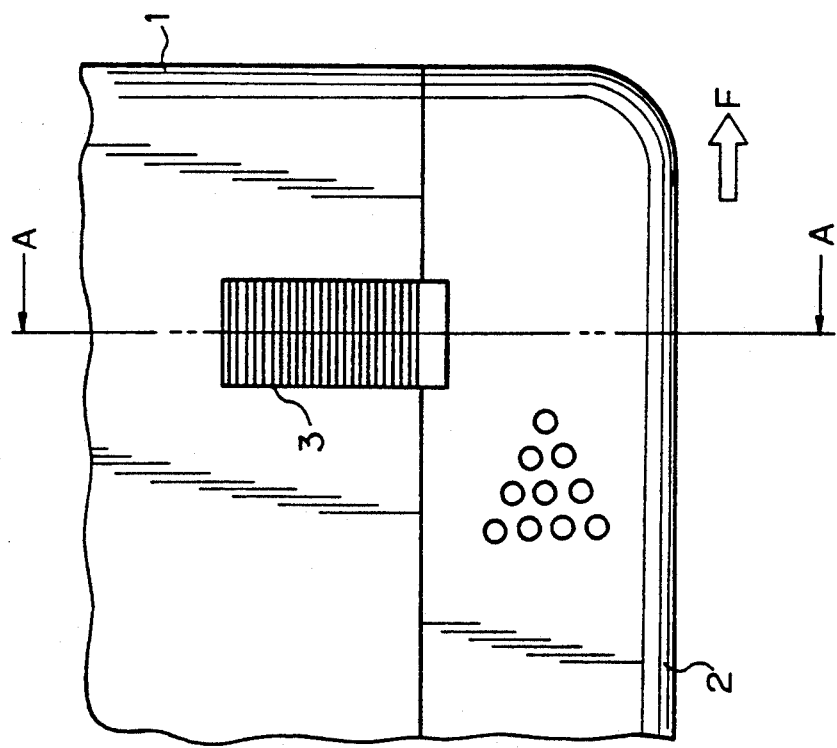

ANTI-FALL STRUCTURE FOR BATTERY COVER OF RADIO COMMUNICATION APPARATUS OR SIMILAR APPARATUS

BACKGROUND OF THE INVENTION

The present invention relates to the structure of the casing of a radio communication apparatus or similar apparatus which is powered by, for example, a dry battery. More particularly, the present invention is concerned with a structure for preventing a battery cover, which is removable from the casing of a radio pager or similar radio communication apparatus for the replacement of a battery, from accidentally coming off the casing.

A radio pager is extensively used today and usually powered by a dry battery having a limited life. The user of the pager, therefore, has to replace the battery when it dies. For the replacement of the battery, part of the casing of the pager comprises a battery cover which can be readily attached to and detached from the casing. Various structures have heretofore been proposed for attaching and detaching the battery cover from the casing. For example, the casing and the battery cover may be provided with respective guide rails and slidably engaged with each other. This kind of conventional structure has a locking mechanism for preventing the battery cover from slipping out of the casing in the sliding direction. Specifically, when the battery cover is attached to the casing, a lug extending out from one end of the battery cover mates with a recess formed in the casing.

The above-described anti-fall structure has a problem in that as the battery cover is repetitively attached to and detached from the casing, the locking engagement of the lug and recess becomes loose due to wear and the battery cover can easily fall off the casing. Moreover, since this type of receiver is transported and operated in severe conditions, the battery cover is apt to come off due to shocks and impacts. Then, the battery would spring out of the casing or the battery cover itself would be lost.

In light of the above, improved anti-fall structures for a radio communication apparatus or similar apparatus are taught in, for example, Japanese Utility Model Laid-Open Publication Nos. 11720/1990 and 11721/1990. The improved anti-fall structures each includes a locking mechanism for preventing the battery cover from easily coming off the casing and has obtained satisfactory results. The anti-fall structure of the present invention constitutes a further improvement over such conventional structures.

SUMMARY OF THE INVENTION

It is an object of the present invention to provide an improved anti-fall structure which surely prevents a battery cover from accidentally falling from the casing of a radio communication apparatus or similar apparatus.

A structure for preventing a battery cover from coming off the casing of a radio communication apparatus or similar apparatus of the present invention has a battery housing section provided on one side of the casing. A battery cover is slidably engageable with the casing for covering the battery housing section. A notch is provided on one side of the battery cover. A slide notch is formed in a portion of the casing which aligns with the notch of the battery cover when the battery cover is fully attached to the casing. A thumb piece is provided to which a locking member having a flexible hook portion including a catch at one end thereof and lugs at the other end is affixed. The thumb piece is retained by the slide notch and is slidable, via the slide notch in a direction substantially perpendicular to a direction in which the battery cover is slidable. The thumb piece is slidable between a first position where the thumb piece is engaged with the notch of the battery cover and a second position where the former is disengaged from the latter. A holding device is provided on the casing for holding the thumb piece in each of the first and second positions via the catch of the flexible hook portion.

BRIEF DESCRIPTION OF THE DRAWINGS

The above and other objects, features and advantages of the present invention will become more apparent from the following detailed description taken with the accompanying drawings in which:

FIG. 4A is a front view showing the embodiment in an unlocked state;

FIG. 4B is a section along line A—A of FIG. 4A;

DESCRIPTION OF THE PREFERRED EMBODIMENT

Figure 6A:
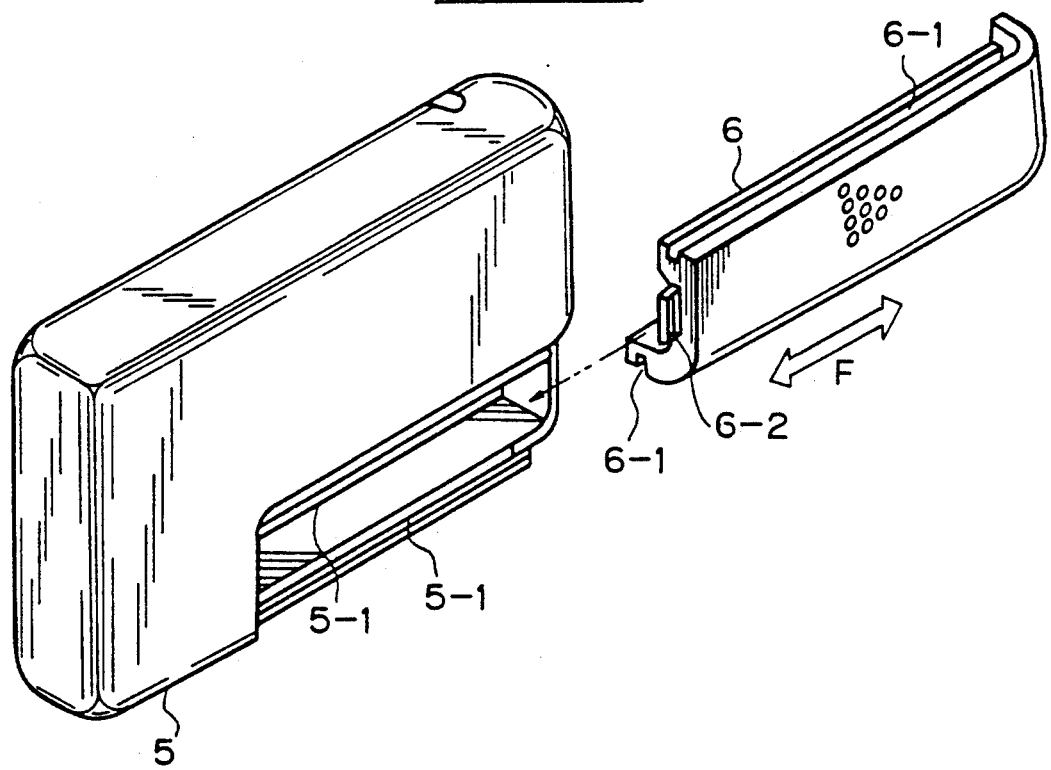
FIG. 6A is an exploded perspective view of a conventional structure for attaching and detaching a battery cover from a radio pager.
Figure 6B:
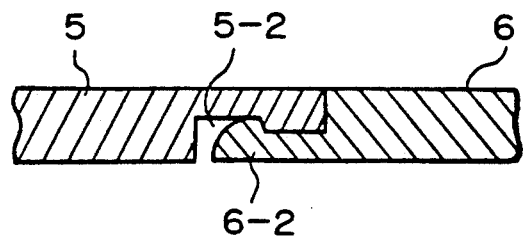
FIG. 6B is a horizontal section showing the conventional structure in an engaged condition.

To better understand the present invention, a brief reference will be made to a prior art structure for attaching and detaching a battery cover from the casing of a radio communication apparatus, shown in FIGS. 6A and 6B. In the figures, the radio communication apparatus is implemented as a radio pager by way of example. As shown, the pager has a casing 5 provided with guide rails 5-1 while a battery cover 6 is provided with guide rails 6-1. The battery cover 6 has the guide rails 6-1 thereof mated with the guide rails 5-1 of the casing 5 and is then slid along the guide rails 5-1 in a direction indicated by an arrow F into or out of the casing 5. As shown in FIG. 6A, a lug 6-2 extends out from one end of the battery cover 6, i.e., the inner end when the battery cover 6 is attached to the casing 5. As shown in FIG. 6B, a recess 5-2 is formed in the casing 5 to mate with the lug 6-2. When the battery cover is fully attached to the casing 5, the lug 6-2 and recess 5-2 mate with each other, as shown in FIG. 6B. In this condition, the battery cover 6 will not easily slip out of the casing 5 in the direction F.

However, the problem with the prior art structure described above is that as the battery cover 6 is repeatedly attached and detached from the casing 5, the locking engagement of the lug 6-2 and recess 5-2 becomes loose due to wear, as discussed earlier. As a result, the battery cover 6 can easily come off the casing 5 by accident.

Figure 1A:
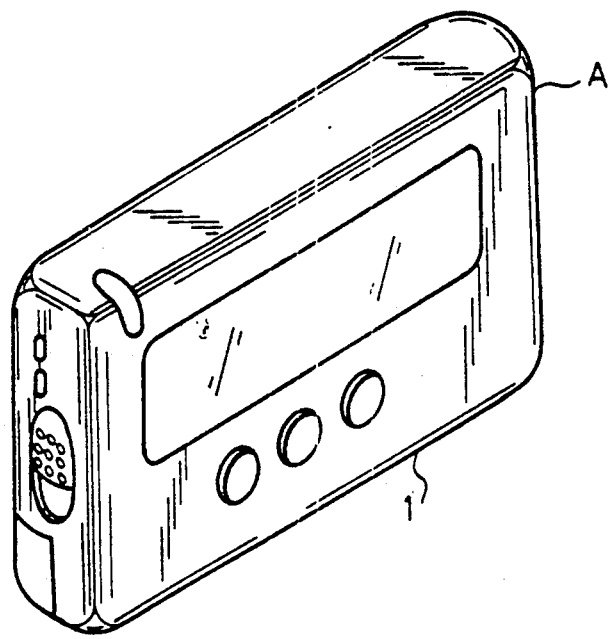
FIG. 1A is a perspective view of a radio communication apparatus provided with an anti-fall structure embodying the present invention and implemented as a radio pager.
Figure 1B:
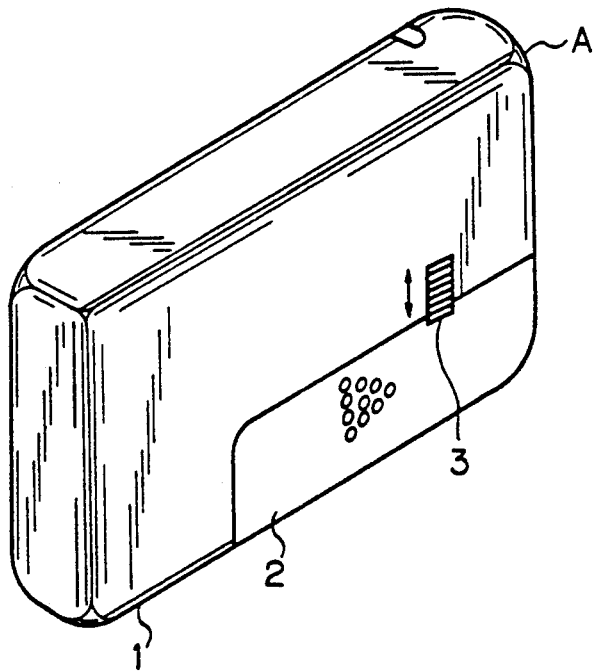
FIG. 1B is a perspective view showing the rear of the pager.
Figure 2A:
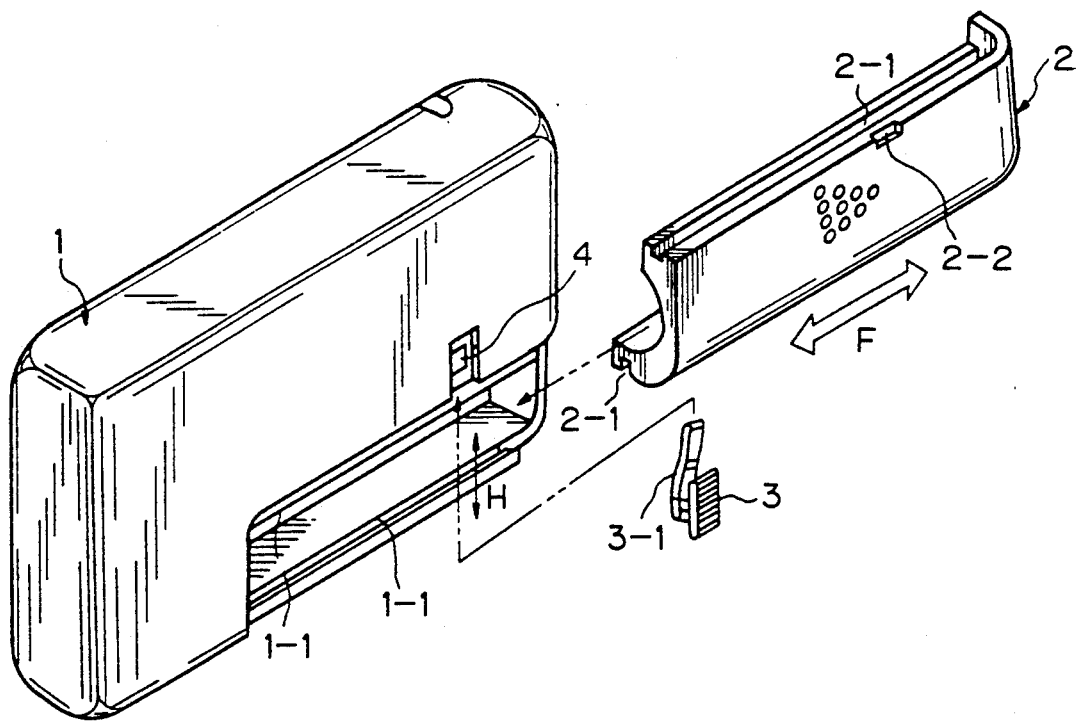
FIG. 2A is an exploded perspective view of an anti-fall structure embodying the present invention.
Figure 2B:
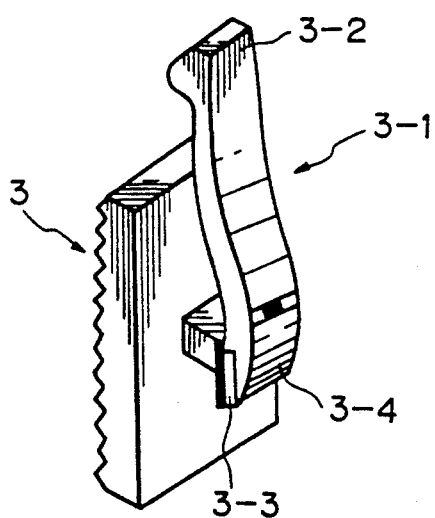
FIG. 2B is an enlarged perspective view of a thumb piece included in the embodiment.
Figure 3A:
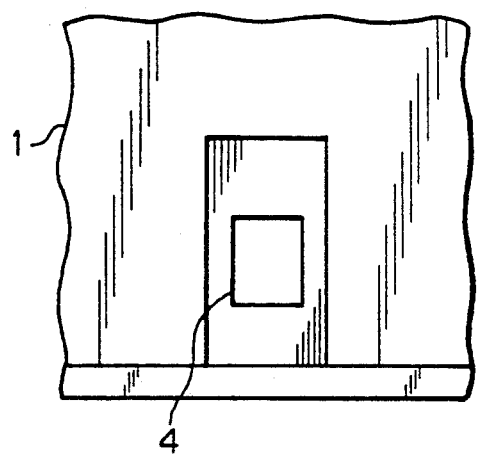
FIG. 3A is a fragmentary front view of the embodiment.
Figure 3B:
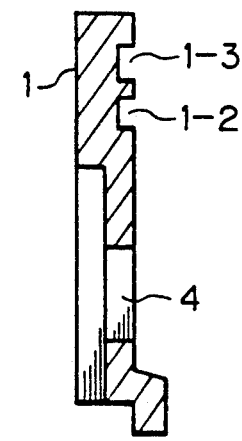
FIG. 3B is a vertical section associated with FIG. 3A.
Figure 3C:
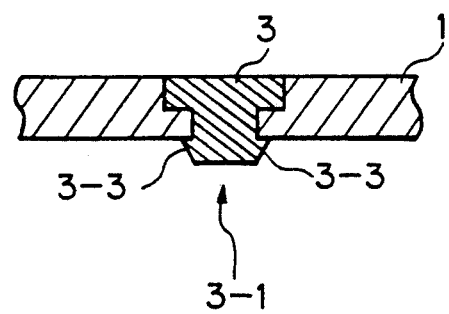
FIG. 3C is a section showing the thumb piece attached to the pager of the embodiment.

Referring to FIGS. 1A and 1B, a radio pager with an anti-fall structure embodying the present invention is shown and generally labeled A. The pager A has a battery cover 2 to facilitate the replacement of a battery accommodated in the pager A. FIGS. 2A, 2B, 3A and 3B show the anti-fall structure in detail. As shown in FIG. 2A, the casing 1 of the pager A has guide rails 1-1 while the battery cover 2 has guide rails 2-1 corresponding in position to the guide rails 1-1. The battery cover 2 is slidable on the casing 1 in a direction F with the guide rails 2-1 thereof mating with the guide rails 1-1. The casing 1 is formed with a slide hole 4 for fitting a thumb piece 3. Filled in the slide hole 4, the thumb piece 3 is slidable in a direction H which is substantially perpendicular to the sliding direction F of the battery cover 2. The battery cover 2 is formed with a notch 2-2 which will align with the slide hole 4 when the cover 2 is fully slid into the casing 1. As shown in FIG. 2B, a locking member 3-1 is affixed to the thumb piece 3. The locking member 3-1 has a hook portion 3-2 having a catch at one end or free end thereof, and lugs 3-3 and 3-4 at the other end. When the locking member 3-1 is inserted into the slide hole 4, the hook portion 3-2 prevents the member 3-1 from easily slipping out of the casing 1. After the battery cover 2 has been attached to the casing 1, the thumb piece 3 is slid in the direction H, FIG. 2A, until it mates with the notch 2-2 of the battery cover 2. As a result, the battery cover 2 is prevented from sliding in the direction F. As shown in FIG. 3B, the casing 1 has recesses 1-2 and 1-3 at the back or inner periphery thereof for receiving the hook portion 3-2 of the locking member 3-1.

FIGS. 4A and 4B show the battery cover 2 in an unlocked state, i.e., a condition wherein the thumb piece 3 is not engaged with the notch 2—2 of the battery cover 2. In this condition, the hook portion 3-2 of the locking member 3-1 is received in the recess 1-3 of the casing 1, retaining the thumb piece 3 in the position shown in FIG. 4A. The battery cover 2 is, therefore, slidable into or out of the casing 1 in the direction F, as desired.

Figure 5B:
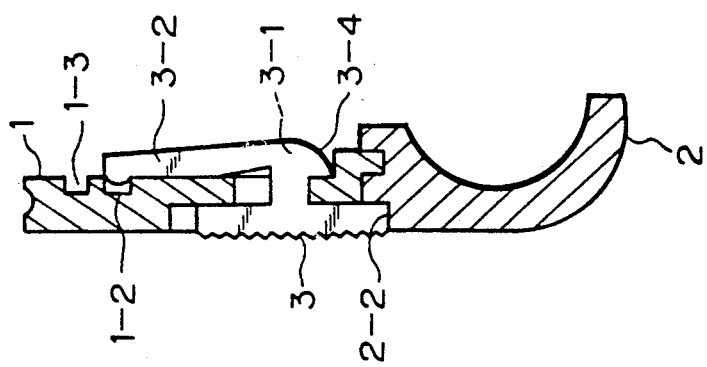
FIG. 5B is a section along line B—B of FIG. 5A.
Figure 5A:
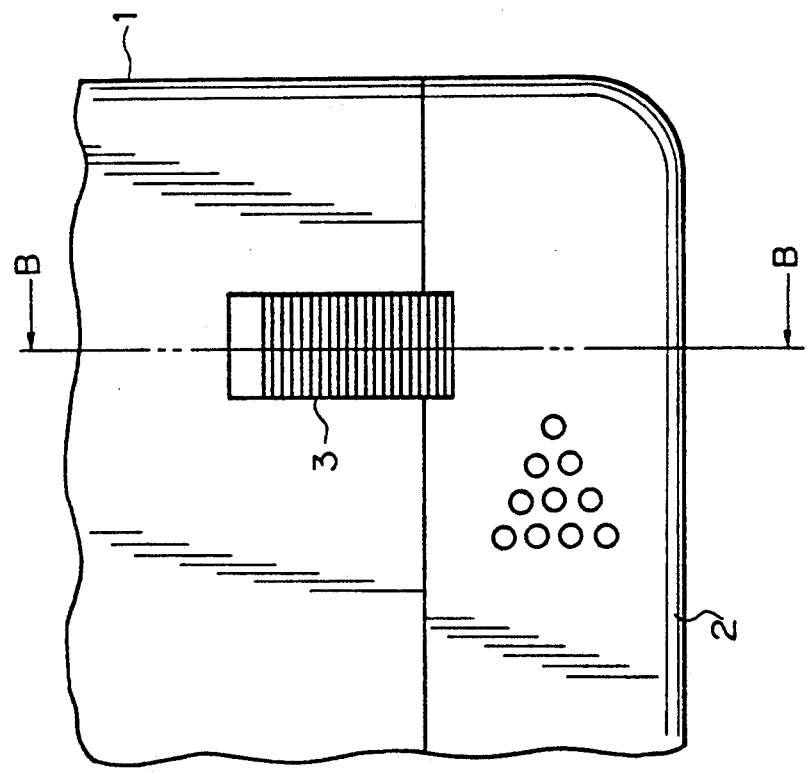
FIG. 5A is a front view showing the embodiment in a locked state.

FIGS. 5A and 5B show a locked stated wherein the thumb piece 3 is engaged with the notch 2—2 of the battery cover 2. In this condition, the battery cover 2 is locked in position by the casing 1, i.e., it is not slidable on the casing 1. At this instant, the thumb piece 3 is fixed in position by the hook portion 3-2 which is received in the recess 1-2 of the casing 1. In addition, the lug 3-4 is caught by the inner periphery of the casing 1. Therefore, the thumb piece 3 itself is prevented from coming off the casing 1 in the locked position. The thumb piece 3 is not movable from the locked position unless a force greater than a predetermined force is intentionally exerted thereon, due to the flexibility of the hook portion 3-2.

In summary, it will be seen that the present invention provides an anti-fall structure which surely prevents a battery cover of a radio communication apparatus or similar apparatus from accidentally sliding on and coming off the casing of the apparatus. This advantage is derived from a unique arrangement wherein a thumb piece is fitted on the casing in such a manner as to be slidable in a direction substantially perpendicular to the sliding direction of the battery cover and is engageable with a notch formed in the battery cover. The thumb piece is held in a locking position due to the engagement of a recess formed in the inner periphery of the casing and a flexible locking member affixed to the thumb piece. The thumb piece does not release the battery casing unless operated intentionally and, therefore, positively retains the battery cover. The locking member is long enough to securely mate with the inner periphery of the casing. Because of this, and because the inner periphery of the casing catches a lug provided on the thumb piece in the locked position, the thumb piece itself is prevented from coming off even when the apparatus falls or is otherwise subjected to a shock.

Various modifications will become possible for those skilled in the art after receiving the teachings of the present disclosure without departing from the scope thereof.

What is claimed is:

1. A structure for preventing a battery cover from coming off a casing of a battery-powered apparatus, comprising:

a battery housing section provided on one side of said casing;

a battery cover slidably engageable with said casing for covering said battery housing section;

a notch provided on one side of said battery cover;

a slide notch formed in a portion of said casing which aligns with said notch of said battery cover when said battery cover is fully attached to said casing;

a thumb piece being retained by said slide notch and being slidable, via said slide notch in a direction substantially perpendicular to a direction in which said battery cover is slidable, between a first position where said thumb piece is engaged with said notch of said battery cover and a second position where said thumb piece is disengaged from said notch, said thumb piece including a locking member, said locking member including a flexible hook portion with a catch at one end of said locking member and lugs at the other end of said locking member, said flexible hook portion aiding in preventing removal of said thumb piece from said slide notch of said casing; and holding means provided on said casing for holding said thumb piece in each of said first and second positions via said catch of said flexible hook portion, wherein said thumb piece sandwiches said casing and said battery cover.

2. A structure as claimed in claim 1, wherein said slide notch includes a through hole communicating with the inside of said casing, said locking member being inserted in and retained by said through hole.

3. A structure as claimed in claim 1, wherein said lugs abut an inner periphery of said casing.

4. A structure as claimed in claim 3, wherein said holding means comprises recesses into which said catch of said flexible hook portion is fittable.

* * * * *